(12) United States Patent
Chien

(10) Patent No.: US 11,374,561 B2
(45) Date of Patent: *Jun. 28, 2022

(54) INTEGRATED CIRCUIT AND METHOD OF TESTING

(71) Applicant: TAIWAN SEMICONDUCTOR MANUFACTURING COMPANY, LTD., Hsinchu (TW)

(72) Inventor: Jinn-Yeh Chien, Chu Bei (TW)

(73) Assignee: TAIWAN SEMICONDUCTOR MANUFACTURING COMPANY, LTD., Hsinchu (TW)

(*) Notice: Subject to any disclaimer, the term of this patent is extended or adjusted under 35 U.S.C. 154(b) by 78 days.

This patent is subject to a terminal disclaimer.

(21) Appl. No.: 16/904,059

(22) Filed: Jun. 17, 2020

(65) Prior Publication Data

US 2020/0321953 A1 Oct. 8, 2020

Related U.S. Application Data

(62) Division of application No. 15/693,848, filed on Sep. 1, 2017, now Pat. No. 10,707,853, which is a division of application No. 14/496,265, filed on Sep. 25, 2014, now Pat. No. 9,768,762.

(51) Int. Cl.
G01R 31/00 (2006.01)
H03K 5/26 (2006.01)
G01R 31/317 (2006.01)

(52) U.S. Cl.
CPC ......... *H03K 5/26* (2013.01); *G01R 31/31725* (2013.01)

(58) Field of Classification Search
USPC ...... 324/555, 76.59, 750.01, 750.3; 714/724, 714/733
See application file for complete search history.

(56) References Cited

U.S. PATENT DOCUMENTS

| 5,854,918 | A | 12/1998 | Baxter |
| 6,668,346 | B1 | 12/2003 | Schulz |
| 2008/0057875 | A1 | 3/2008 | Kawashima |
| 2008/0211560 | A1 | 9/2008 | Lam |
| 2009/0051396 | A1 | 2/2009 | Shimamoto |
| 2009/0287974 | A1 | 11/2009 | Kojima |

*Primary Examiner* — Vincent Q Nguyen
(74) *Attorney, Agent, or Firm* — Hauptman Ham, LLP

(57) ABSTRACT

An integrated circuit includes a first circuit having a loopback path electrically coupled to an inverter and a test circuit having a controller and a counter. The test circuit is electrically coupled to the first circuit, and the controller is configured to select the loopback path. The first circuit is configured to receive a first voltage signal and to generate an oscillating signal from the received first voltage signal. The first voltage signal is either a substantially low logic level signal or a substantially high logic level signal. The counter is configured to count oscillations of the oscillating signal.

20 Claims, 7 Drawing Sheets

INTEGRATED CIRCUIT AND METHOD OF TESTING

PRIORITY CLAIM

The present application a divisional of U.S. application Ser. No. 15/693,848, filed Sep. 1, 2017, which is a divisional of U.S. application Ser. No. 14/496,265, filed Sep. 25, 2014, now U.S. Pat. No. 9,768,762, issued Sep. 19, 2017, each of which is incorporated herein by reference in its entirety.

BACKGROUND

The semiconductor integrated circuit (IC) industry has produced a wide variety of digital devices to address issues in a number of different areas. In some of these digital devices, a clock tree is generally used for distributing a common clock signal to various components in order to synchronize the operation thereof. Differences in the arrival time of the clock signals at two or more clocked components of the IC can result in errors affecting IC performance.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
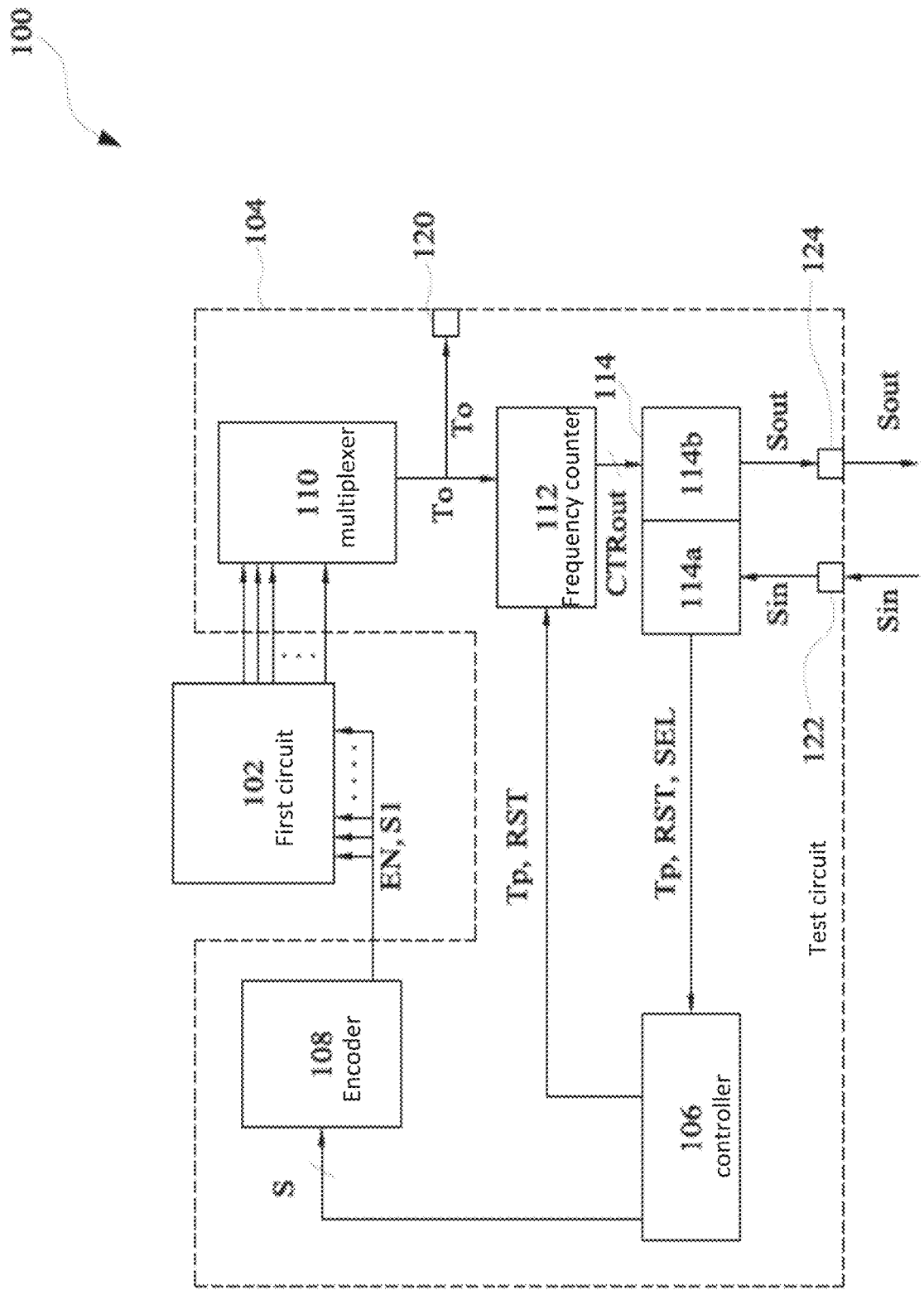
FIG. 1 is a block diagram of a portion of an integrated circuit in accordance with one or more embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

An integrated circuit includes a first circuit and a test circuit. The test circuit is connected to the first circuit and is configured to test the first circuit. The first circuit includes a plurality of flip-flops and a plurality of data paths. In some embodiments, each data path of the plurality of data paths is connected to one or more of the plurality of flip-flops. The test circuit includes a plurality of loopback paths, a controller, a multiplexer connected to the plurality of loopback paths and a counter connected to the multiplexer. The controller is configured to select a loopback path from the plurality of loopback paths and a data path from the plurality of data paths. The selected loopback path and the selected data path are connected in a closed loop. In some embodiments, the selected data path includes one or more buffers or one or more inverters. The multiplexer is configured to selectively output a first signal including an oscillation frequency, wherein the first signal is applied to the selected loopback path. The counter is configured to measure the oscillation frequency of the first signal. In some embodiments, a timing of a signal applied to a loopback path and a data path are measured by a test circuit. In some embodiments, a plurality of measurements is made by the counter. In some embodiments, the measurements are compared in order to generate an on-chip variation (OCV) profile of the integrated circuit. In some embodiments, OCV includes process, voltage and temperature (PVT) variation effects in the integrated circuit.

FIG. 1 is a block diagram of a portion of an integrated circuit 100 in accordance with one or more embodiments. Integrated circuit 100 comprises a first circuit 102 and a test circuit 104. First circuit 102 is connected to test circuit 104. Test circuit 104 is configured to test the first circuit 102.

In some embodiments, first circuit 102 includes a plurality of data paths connected to one or more leaf cells. In some embodiments, first circuit 102 also includes a plurality of loopback paths. In some embodiments, a data path is selected from the plurality of data paths. In some embodiments, a loopback path is selected from the plurality of loopback paths. In some embodiments, a signal is applied to a selected loopback path and a selected data path, and an oscillation frequency of the applied signal is measured by test circuit 104. In some embodiments, by applying at least one control signal S to first circuit 102, first circuit 102 is configured to generate a signal To with an oscillation frequency Fo, and test circuit 104 is configured to measure oscillation frequency Fo of signal To. In some embodiments, the selected loopback path and the selected data path form a closed loop. In some embodiments, each of the loopback paths comprises a circuit component which is configured to test a loopback path and a data path. In some embodiments, first circuit 102 comprises a plurality of first circuits 102.

Test circuit 104 is configured to test the timing of the selected loopback path and the selected data path of the first circuit 102. In some embodiments, test circuit 104 is configured to receive a selection control signal SEL from an external source, wherein selection control signal SEL indicates a test operational mode of integrated circuit 100 or first circuit 102. In some embodiments, the test mode is an operational mode of first circuit 102 that is utilized to test first circuit 102. In some embodiments, test circuit 104 is configured to receive selection control signal SEL from an external source, wherein selection control signal SEL indicates a normal operational mode of integrated circuit 100 or first circuit 102. In some embodiments, the normal operational mode is an operational mode of first circuit 102 that is utilized to operate first circuit 102 in a normal mode. Test circuit 104 and first circuit 102 are embedded in the same primary circuit (e.g., integrated circuit 100). In some embodiments, test circuit 104 and first circuit 102 together form a built-in self-test (BIST) circuit (e.g., integrated circuit 100).

Test circuit 104 comprises a controller 106, an encoder 108, a multiplexer 110, a frequency counter 112, an interface 114, a ring output pad 120, a first input pad 122 and a first output pad 124.

Controller 106 is connected to encoder 108, frequency counter 112 and interface 114. In some embodiments, controller 106 is connected to encoder 108 by a bus. Controller 106 is configured to receive a reset control signal RST, selection control signal SEL and/or a time period control signal Tp from interface 114. In some embodiments, reset control signal RST is configured to reset frequency counter 112 to zero. In some embodiments, time period control signal Tp is configured to set a duration of measuring an oscillation frequency Fo of a signal To. Controller 106 is configured to send reset control signal RST and/or time period control signal Tp to frequency counter 112. Controller 106 is configured to send at least one control signal S to encoder 108. In some embodiments, at least one control signal S comprises a clock signal and a first control signal S1. In some embodiments, first control signal S1 is a data signal at a logically low level or a logically high level. In some embodiments, first control signal S1 comprises a plurality of control signals. In some embodiments, controller 106 is a timing controller configured to control the timing of test circuit 104. In some embodiments, controller 106 is a timing controller configured to control the timing of encoder 108. In some embodiments, controller 106 is configured to determine a loopback path from the plurality of loopback paths and a data path from the plurality of data paths. In some embodiments, controller 106 is configured to select a loopback path from the plurality of loopback paths and a data path from the plurality of data paths. In some embodiments, controller 106 is a finite state machine. In some embodiments, controller 106 is an application specific integrated circuit (ASIC). In some embodiments, controller 106 comprises a processor (e.g., processor 502 shown in FIG. 5).

Encoder 108 is connected to controller 106 and first circuit 102. In some embodiments, encoder 108 is connected to first circuit 102 by a parallel connection. Encoder 108 is configured to receive at least one control signal S from controller 106. Encoder 108 is configured to send a first control signal S1 to first circuit 102. In some embodiments, first control signal S1 comprises a second control signal EN. Encoder 108 is configured to send second control signal EN to first circuit 102. In some embodiments, second control signal EN comprises a plurality of second control signals (e.g. second control signal EN1, EN2 and EN3 in FIGS. 2A-2B). In some embodiments, second control signal EN is a logically low level or a logically high level. Encoder 108 is configured to select the loopback path from the plurality of loopback paths by sending second control signal EN to first circuit 102.

Multiplexer 110 is connected to first circuit 102, frequency counter 112 and ring output pad 120. In some embodiments, multiplexer 110 is connected to first circuit 102 by a parallel connection. In some embodiments, multiplexer 110 is an output multiplexer. In some embodiments, multiplexer 110 comprises a plurality of output multiplexers. In some embodiments, multiplexer 110 is connected to a plurality of first circuits 102. In some embodiments, multiplexer 110 is configured to receive second control signal EN from encoder 108. In some embodiments, multiplexer 110 is configured to receive second control signal EN from controller 106. Multiplexer 110 is configured to send signal To with oscillation frequency Fo to frequency counter 112 and ring output pad 120. In some embodiments, signal To is a signal which oscillates between a low logical level and a high logical level at an oscillation frequency Fo. Multiplexer 110 is configured to selectively output signal To with oscillation frequency Fo to frequency counter 112 and ring output pad 120.

Frequency counter 112 is connected to controller 106, output multiplexer 110, interface 114 and ring output pad 120. Frequency counter 112 is configured to receive reset control signal RST and/or time period control signal Tp from controller 106. Frequency counter 112 is configured to receive signal To with oscillation frequency Fo from multiplexer 110. In some embodiments, frequency counter 112 is a ripple counter configured to count oscillation frequency Fo of signal To. In some embodiments, frequency counter 112 is a ripple counter configured to receive time period control signal Tp of the ripple counter from the controller 106, wherein the time period control signal Tp is a duration or period of counting the oscillation frequency Fo of the signal To. In some embodiments, frequency counter 112 is a ripple counter configured to receive reset control signal RST from the controller 106, and is configured to reset the count of the ripple counter upon receipt of the reset control signal RST. Frequency counter 112 is configured to send the measured oscillation frequency Fo of signal To to interface 114. In some embodiments, the measurement period, defined by the time period control signal Tp, is less than a period of signal To.

Interface 114 is connected to controller 106, frequency counter 112, and first input pad 122 and first output pad 124. Interface 114 comprises an input interface 114a and an output interface 114b. In some embodiments, interface 114 comprises a single input and output interface.

Input interface 114a is an input interface configured to receive an input signal Sin from first input pad 122. In some embodiments, input signal Sin comprises selection control signal SEL, time period control signal Tp or reset control signal RST. In some embodiments, input interface 114a is a serial to parallel interface. Input interface 114a is configured to send time period control signal Tp or reset control signal RST to controller 106. In some embodiments, input interface 114a is configured to comply with Joint Test Action Group (JTAG), Inter-Integrated Circuit (I2C) or Serial Peripheral Interface (SPI).

Output interface 114b is an output interface configured to send an output signal Sout to first output pad 124. In some embodiments, output signal Sout comprises the measured oscillation frequency Fo of signal To. In some embodiments, output interface 114b is a parallel to serial interface. Output interface 114b is configured to receive the measured oscillation frequency Fo of signal To from frequency counter 112. In some embodiments, output interface 114b is configured to comply with Joint Test Action Group (JTAG), Inter-Integrated Circuit (I2C) or Serial Peripheral Interface (SPI).

Ring output pad 120 is an output connection (also referred to as a pad) coupled to multiplexer 110, frequency counter 112 and one or more external elements. Ring output pad 120 is configured to receive the measured oscillation frequency Fo of signal To from multiplexer 110. Ring output pad 120 is configured to send measured oscillation frequency Fo of signal To.

First input pad 122 is an input connection (also referred to as a pad) coupled to input interface 114a and one or more external elements. First input pad 122 is configured to receive input signal Sin from one or more external elements. First input pad 122 is configured to send input signal Sin to input interface 114a.

First output pad 124 is an output connection (also referred to as a pad) coupled to output interface 114b and one or more external elements. First output pad 124 is configured to receive output signal Sout from output interface 114b. First output pad 124 is configured to send output signal Sout to one or more external elements.

Figure 2A:
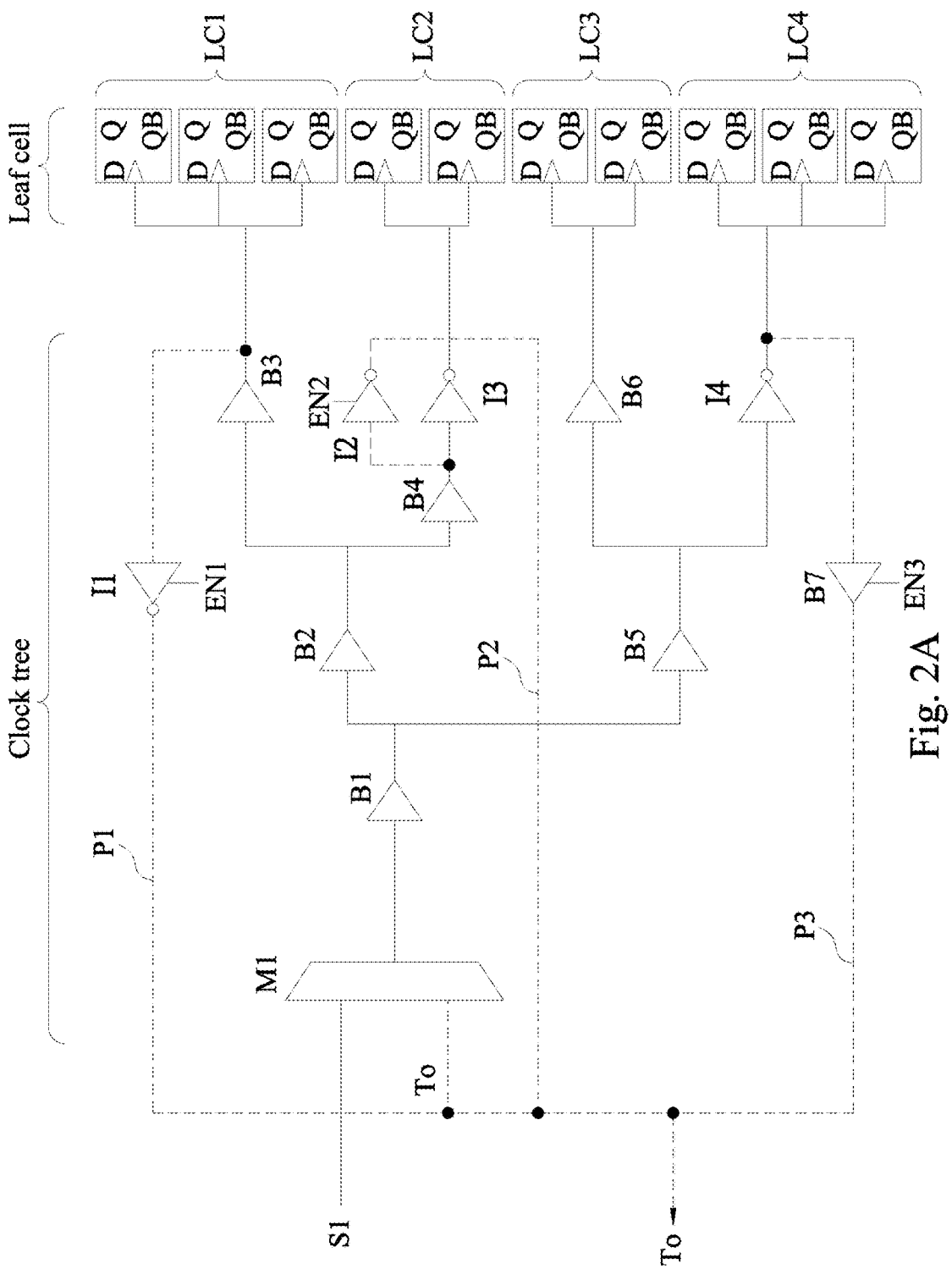
FIG. 2A is schematic diagram of a first circuit in accordance with one or more embodiments.

FIG. 2A is a schematic diagram of a first circuit 200 in accordance with one or more embodiments. First circuit 200 is an embodiment of first circuit 102 shown in FIG. 1 with similar elements.

First circuit 200 is configured to receive first control signal S1 from the encoder (for example, encoder 108 (FIG. 1)). First circuit 200 is configured to receive second control signal EN from the encoder. In some embodiments, second control signal EN comprises a plurality of second control signals (e.g., second control signal EN1, EN2 and EN3). In some embodiments, second control signal EN1, EN2 or EN3 is a logically low level or a logically high level. In some embodiments, second control signals EN1, EN2 and EN3 (from the encoder) are arranged in a one-hot encoding such that one of the second control signals (e.g., EN1, EN2 or EN3) are logically high, and the other second control signals (e.g., EN1, EN2 and EN3) are logically low. First circuit 200 is configured to send output signal To and oscillation frequency Fo to the frequency counter (e.g., frequency counter 112 (FIG. 1)).

In some embodiments, first circuit 200 includes one or more clock trees connected to one or more leaf cells (e.g., leaf cells LC1, LC2, LC3 and LC4) by a plurality of data paths (e.g., data path including buffers B1, B2 and B3 or data path including buffers B1, B2 and B4 or data path including buffers B1 and B5 and inverter I4).

First circuit 200 comprises a multiplexer M1, a buffer B1, a buffer B2, a buffer B3, a buffer B4, a buffer B5, a buffer B6, a buffer B7, a plurality of leaf cells LC1, LC2, LC3 and LC4, an inverter I1, an inverter I2, an inverter I3 and an inverter I4. Data signal connections to first circuit 200 and the components therein are omitted for clarity.

In some embodiments, multiplexer M1, buffers B1, B2, B3, B4, B5 and B6, inverters I3 and I4, and leaf cells LC1, LC2, LC3 and LC4 form a primary portion of first circuit 200. In some embodiments, loopback paths P1, P2 and P3, inverters I1 and I2 and buffer B7 form a portion of a test circuit configured to test the primary portion of first circuit 200.

Multiplexer M1 is connected to loopback paths P1, P2 and P3, buffer B1, the encoder and the frequency counter. Multiplexer M1 comprises two input ports, a select input port (not shown) and an output port. The select input port (not shown) is used to select which input ports are sent to the output port. In some embodiments, multiplexer M1 includes a plurality of multiplexers.

Multiplexer M1 is configured to receive first control signal S1 from the encoder. In some embodiments, during a test mode operation, first circuit 200 is configured to act as a ring oscillator. In some embodiments, during a test mode operation, first control signal S1 is applied to multiplexer M1, and a signal To is generated from the first control signal S1, wherein the signal To oscillates between the low logical level and the high logical level at an oscillation frequency Fo. In some embodiments, prior to generation of signal To, multiplexer M1 is configured to selectively output first control signal S1. In some embodiments, once the signal To is generated from the first control signal S1, multiplexer M1 is configured to receive the signal To and corresponding oscillation frequency Fo. In some embodiments, once the signal To is generated from the first control signal S1, multiplexer M1 is configured to selectively output the signal To and corresponding oscillation frequency Fo.

Buffer B1 is connected to multiplexer M1 and buffers B2 and B5. Buffer B1 is configured to receive a data signal (not shown), signal To or first control signal S1. In some embodiments, the data signal (not shown) is a logically low or logically high signal utilized by lead cells LC1, LC2, LC3 or LC4. Buffer B1 is configured to delay and output the data signal (not shown), signal To or first control signal S1.

Buffer B2 is connected to buffers B1, B3 and B4. Buffer B2 is configured to receive the data signal (not shown), signal To or first control signal S1. Buffer B2 is configured to delay and output the data signal (not shown), signal To or first control signal S1.

Buffer B3 is connected to buffers B2 and B4, leaf cell LC1 and inverter I1 by loopback path P1. Buffer B3 is configured to receive the data signal (not shown), signal To or first control signal S1. Buffer B3 is configured to delay and output the data signal (not shown), signal To or first control signal S1.

Buffer B4 is connected to buffers B2 and B3 and inverters I2 and I3. Buffer B4 is configured to receive the data signal (not shown), signal To or first control signal S1. Buffer B4 is configured to delay and output the data signal (not shown), signal To or first control signal S1.

Buffer B5 is connected to buffers B1, B2, and B6 and inverter I4. Buffer B5 is configured to receive the data signal (not shown), signal To or first control signal S1. Buffer B5 is configured to delay and output the data signal (not shown), signal To or first control signal S1.

Buffer B6 is connected to buffer B5, leaf cell LC3 and inverter I4. Buffer B6 is configured to receive the data signal (not shown), signal To or first control signal S1. Buffer B6 is configured to delay and output the data signal (not shown), signal To or first control signal S1.

Buffer B7 is connected by loopback path P3 to leaf cell LC4 and inverter I4. Buffer B7 is configured to receive the data signal (not shown), signal To or first control signal S1. Buffer B7 is configured to receive second control signal EN3. In some embodiments, upon receipt of a logically high second control signal EN3, buffer B7 is configured to be activated, and is configured to electrically connect the loopback path P3 to multiplexer M1 and the frequency counter. In some embodiments, if buffer B7 is activated, buffer B7 is configured to delay and output the data signal (not shown), signal To or first control signal S1. In some embodiments, upon receipt of a logically low second control signal EN3, buffer B7 is configured to be deactivated, and is configured to electrically disconnect the loopback path P3 from multiplexer M1 and the frequency counter. In some embodiments, if buffer B7 is activated, inverters I1 and I2 are deactivated.

Inverter I1 is connected by loopback path P1 to leaf cell LC1, inverter I4 and multiplexer M1. Inverter I1 is configured to receive the data signal (not shown), signal To or first control signal S1. Inverter I1 is configured to receive second control signal EN1. In some embodiments, upon receipt of a logically high second control signal EN1, inverter I1 is configured to be activated, and is configured to electrically connect the loopback path P1 to multiplexer M1 and the frequency counter. In some embodiments, if inverter I1 is activated, inverter I1 is configured to output the inverted data signal (not shown), inverted signal To or inverted first control signal S1. In some embodiments, upon receipt of a logically low second control signal EN1, inverter I1 is configured to be deactivated, and is configured to electrically disconnect the loopback path P1 from multiplexer M1 and the frequency counter. In some embodiments, if inverter I1 is activated, inverter I2 and buffer B7 are deactivated.

Inverter I2 is connected by loopback path P2 to buffer B4, inverter I3 and multiplexer M1. Inverter I2 is configured to receive the data signal (not shown), signal To or first control signal S1. Inverter I2 is configured to receive second control signal EN2. In some embodiments, upon receipt of a logically high second control signal EN2, inverter I2 is configured to be activated, and is configured to electrically connect the loopback path P2 to multiplexer M1 and the frequency counter. In some embodiments, if inverter I2 is activated, inverter I2 is configured to output the inverted data signal (not shown), inverted signal To or inverted first control signal S1. In some embodiments, upon receipt of a logically low second control signal EN2, inverter I2 is configured to be deactivated, and is configured to electrically disconnect the loopback path P2 from multiplexer M1 and the frequency counter. In some embodiments, if inverter I2 is activated, inverter I1 and buffer B7 are deactivated.

Inverter I3 is connected to buffer B4, inverter I2 and leaf cells LC2. Inverter I3 is configured to receive the data signal (not shown), signal To or first control signal S1. Inverter I3 is configured to output the inverted data signal (not shown), inverted signal To or inverted first control signal S1.

Inverter I4 is connected to buffers B5 and B6, leaf cells LC4 and buffer B7 by loopback path P3. Inverter I4 is configured to receive the data signal (not shown), signal To or first control signal S1. Inverter I4 is configured to output the inverted data signal (not shown), inverted signal To or inverted first control signal S1.

Leaf cells LC1 are connected to buffer B3 and inverter I1. Leaf cells LC1 are configured to receive the data signal (not shown), signal To or first control signal S1. In some embodiments, leaf cells LC1 are one or more flip-flops. In some embodiments, leaf cells LC1 are one or more registers.

Leaf cells LC2 are connected to inverter I3. Leaf cells LC2 are configured to receive the data signal (not shown), signal To or first control signal S1. In some embodiments, leaf cells LC2 are one or more flip-flops. In some embodiments, leaf cells LC2 are one or more registers.

Leaf cells LC3 are connected to buffer B6. Leaf cells LC3 are configured to receive the data signal (not shown), signal To or first control signal S1. In some embodiments, leaf cells LC3 are one or more flip-flops. In some embodiments, leaf cells LC3 are one or more registers.

Leaf cells LC4 are connected to inverter I4. Leaf cells LC4 are configured to receive the data signal (not shown), signal To or first control signal S1. In some embodiments, leaf cells LC4 are one or more flip-flops. In some embodiments, leaf cells LC4 are one or more registers.

Loopback path P1 is connected to inverter I1, multiplexer M1, buffer B3 and leaf cells LC1. Loopback path P1 comprises a circuit component (e.g., inverter I1) selectively activated by second control signal EN1. In some embodiments, if inverter I1 is activated, loopback path P1 is electrically connected to multiplexer M1, and loopback paths P2 and P3 are electrically disconnected from multiplexer M1. In some embodiments, loopback path P1 and a data path (e.g., the data path formed by buffers B1, B2 and B3) form a closed loop. In some embodiments, the closed loop formed by loopback path P1 and the data path (e.g., the data path formed by buffers B1, B2 and B3) are tested to measure oscillation frequency Fo of signal To applied to the closed loop. In some embodiments, the closed loop formed by loopback path P1 and the data path (e.g., the data path formed by buffers B1, B2 and B3) comprises an odd number of series connected inverters. In some embodiments, the closed loop formed by loopback path P1 and the data path (e.g., the data path formed by buffers B1, B2 and B3) functions as a ring oscillator. In some embodiments, loopback path P1 is an inverted loopback path comprising inverter I1. In some embodiments, the connection between loopback path P1 and the data path (e.g., the data path formed by buffers B1, B2 and B3) is located between multiplexer M1 and leaf cells LC1. In some embodiments, the closed loop formed by loopback path P1 and the data path (e.g., the data path formed by buffers B1, B2 and B3) are part of a clock tree in integrated circuit 100.

Loopback path P2 is connected to inverter I2, inverter I3, multiplexer M1 and buffer B4. Loopback path P2 comprises a circuit component (e.g., inverter I2) selectively activated by second control signal EN2. In some embodiments, if inverter I2 is activated, loopback path P2 is electrically connected to multiplexer M1, and loopback paths P1 and P3 are electrically disconnected from multiplexer M1. In some embodiments, loopback path P2 and a data path (e.g., the data path formed by buffers B1, B2 and B4) form a closed loop. In some embodiments, the closed loop formed by loopback path P2 and the data path (e.g., the data path formed by buffers B1, B2 and B4) are tested to measure oscillation frequency Fo of signal To applied to the closed loop. In some embodiments, the closed loop formed by loopback path P2 and the data path (e.g., the data path formed by buffers B1, B2 and B4) comprises an odd number of series connected inverters. In some embodiments, the closed loop formed by loopback path P2 and the data path (e.g., the data path formed by buffers B1, B2 and B4) functions as a ring oscillator. In some embodiments, loopback path P2 is a shadow logic loopback path comprising inverter I2. In some embodiments, the connection between loopback path P2 and the data path (e.g., the data path formed by buffers B1, B2 and B4) is located between multiplexer M1 and leaf cells LC2. In some embodiments, loopback path P2 and a data path (e.g., the data path formed by buffers B1, B2 and B4) are part of a clock tree in integrated circuit 100.

Loopback path P3 is connected to inverter I4, multiplexer M1, buffer B7 and leaf cells LC4. Loopback path P3 comprises a circuit component (e.g., buffer B7) selectively activated by second control signal EN3. In some embodiments, if buffer B7 is activated, loopback path P3 is electrically connected to multiplexer M1, and loopback paths P1 and P2 are electrically disconnected from multiplexer M1. In some embodiments, loopback path P3 and a data path (e.g., the data path formed by buffers B1 and B5 and inverter I4) form a closed loop. In some embodiments, the closed loop formed by loopback path P3 and the data path (e.g., the data path formed by buffers B1 and B5 and inverter I4) are tested to measure oscillation frequency Fo of signal To applied to the closed loop. In some embodiments, the closed loop formed by loopback path P3 and the data path (e.g., the data path formed by buffers B1 and B5 and inverter I4) comprises an odd number of series connected inverters. In some embodiments, the closed loop formed by loopback path P3 and the data path (e.g., the data path formed by buffers B1 and B5 and inverter I4) functions as a ring oscillator. In some embodiments, loopback path P3 is a non-inverted loopback path comprising buffer B7. In some embodiments, the connection between loopback path P3 and the data path (e.g., the data path formed by buffers B1 and B5 and inverter I4) is located between multiplexer M1 and leaf cells LC4. In some embodiments, loopback path P3 and a data path (e.g., the data path formed by buffers B1 and B5 and inverter I4) are part of a clock tree in integrated circuit 100.

Although FIG. 2A illustrates three loopback paths connected to multiplexer M1, (e.g., path P1 and path P2), alternative embodiments include two loopback paths connected to multiplexer M1 or more than three loopback paths connected to multiplexer M1, consistent with the teachings disclosed herein. In some embodiments, multiplexer M1 includes a plurality of multiplexers.

Figure 2B:
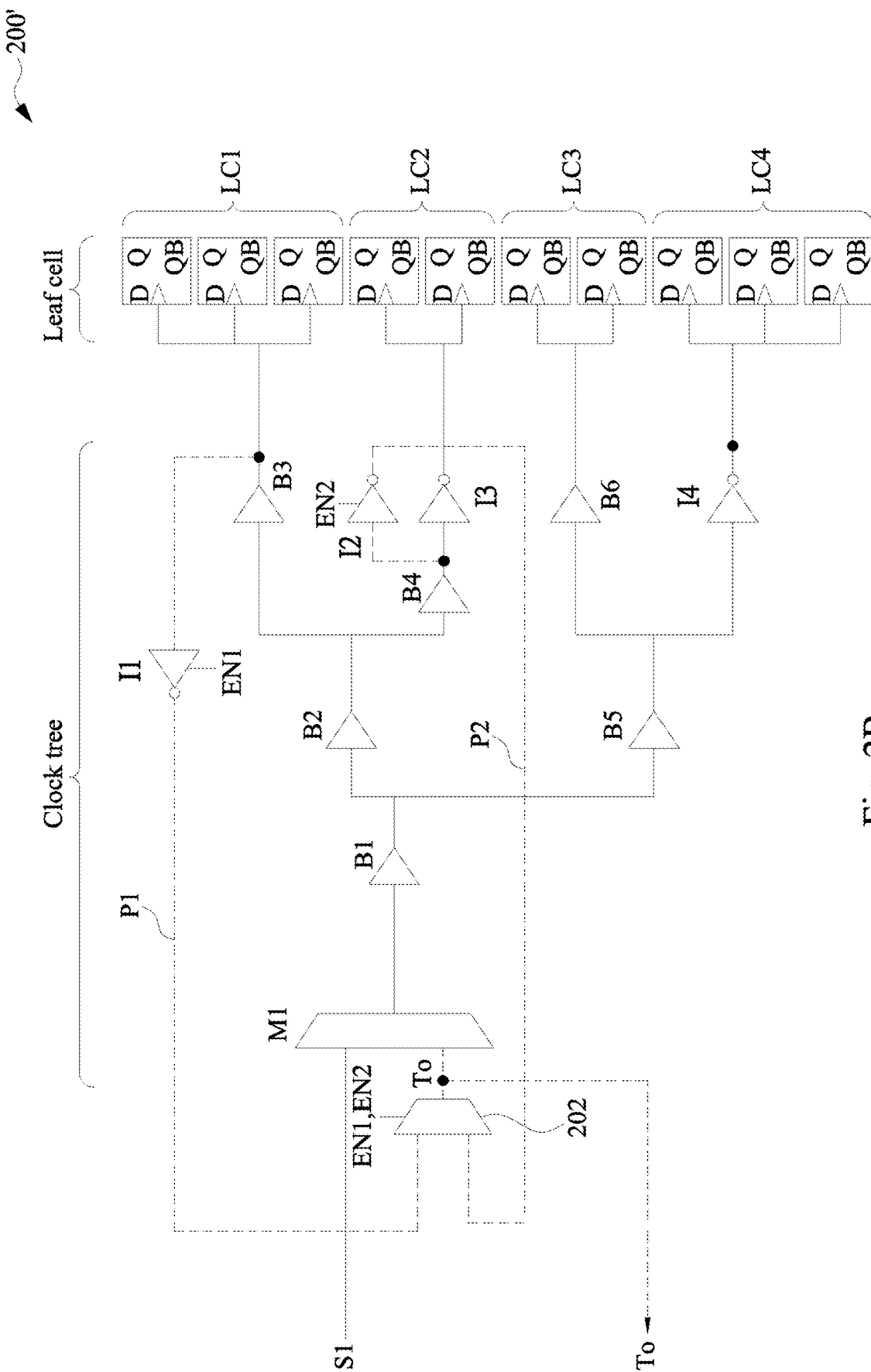
FIG. 2B is schematic diagram of a first circuit in accordance with one or more embodiments.

FIG. 2B is a schematic diagram of a first circuit 200' in accordance with one or more embodiments. First circuit 200' is an embodiment of first circuit 102 shown in FIG. 1 with similar elements. First circuit 200' is an embodiment of first circuit 200 shown in FIG. 2A with similar elements. In comparison with FIG. 2A, first circuit 200' (of FIG. 2B) includes multiplexer 202. Multiplexer 202 is an embodiment of multiplexer 110 shown in FIG. 1 with similar elements. In comparison with FIG. 2A, first circuit 200' (of FIG. 2B) does not include loopback path P3 and buffer B7.

Multiplexer 202 is connected to loopback paths P1 and P2, multiplexer M1, encoder 108 (FIG. 1) and frequency counter 112 (FIG. 1). Multiplexer 202 comprises two input ports, a select input port and an output port. The select input port is used to select which input ports are sent to the output port.

A first input port of multiplexer 202 is connected to loopback path P1. A second input port of multiplexer 202 is connected to loopback path P2. In some embodiments, the first input port of multiplexer 202 is configured to receive signal To, if inverter I1 is activated by second control signal EN1. In some embodiments, the second input port of multiplexer 202 is configured to receive signal To, if inverter I2 is activated by second control signal EN2.

A select input port of multiplexer 202 is connected to encoder 108 (FIG. 1). A select input port of multiplexer 202 is configured to receive second control signal EN1 and EN2 from encoder 108 (not shown). In some embodiments, multiplexer 202 is electrically connected to inverter I1, if inverter I1 is activated by second control signal EN1. In some embodiments, multiplexer 202 is electrically connected to inverter I2, if inverter I2 is activated by second control signal EN2.

An output port of multiplexer 202 is connected to frequency counter 112 (FIG. 1). The output port of multiplexer 202 is configured to selectively output signal To and oscillation frequency Fo to frequency counter. In some embodiments, multiplexer 202 is configured to output signal To and oscillation frequency Fo applied to the first input port of multiplexer 202, if the select input port of multiplexer 202 receives the second control signal EN1. In some embodiments, multiplexer 202 is configured to output signal To and oscillation frequency Fo applied to the second input port of multiplexer 202, if the select input port of multiplexer 202 receives the second control signal EN2.

Although FIG. 2B illustrates two loopback paths connected to multiplexer 202, (e.g., loopback path P1 and loopback path P2), alternative embodiments include more than two loopback paths connected to multiplexer 202, consistent with the teachings disclosed herein. In some embodiments, multiplexer 202 includes $2^m$ input ports and m select lines, where m is an integer corresponding to the number of select lines. In some embodiments, the select input ports are used to select which input ports are sent to the output port. In some embodiments, multiplexer 202 includes a plurality of multiplexers.

Figure 3:
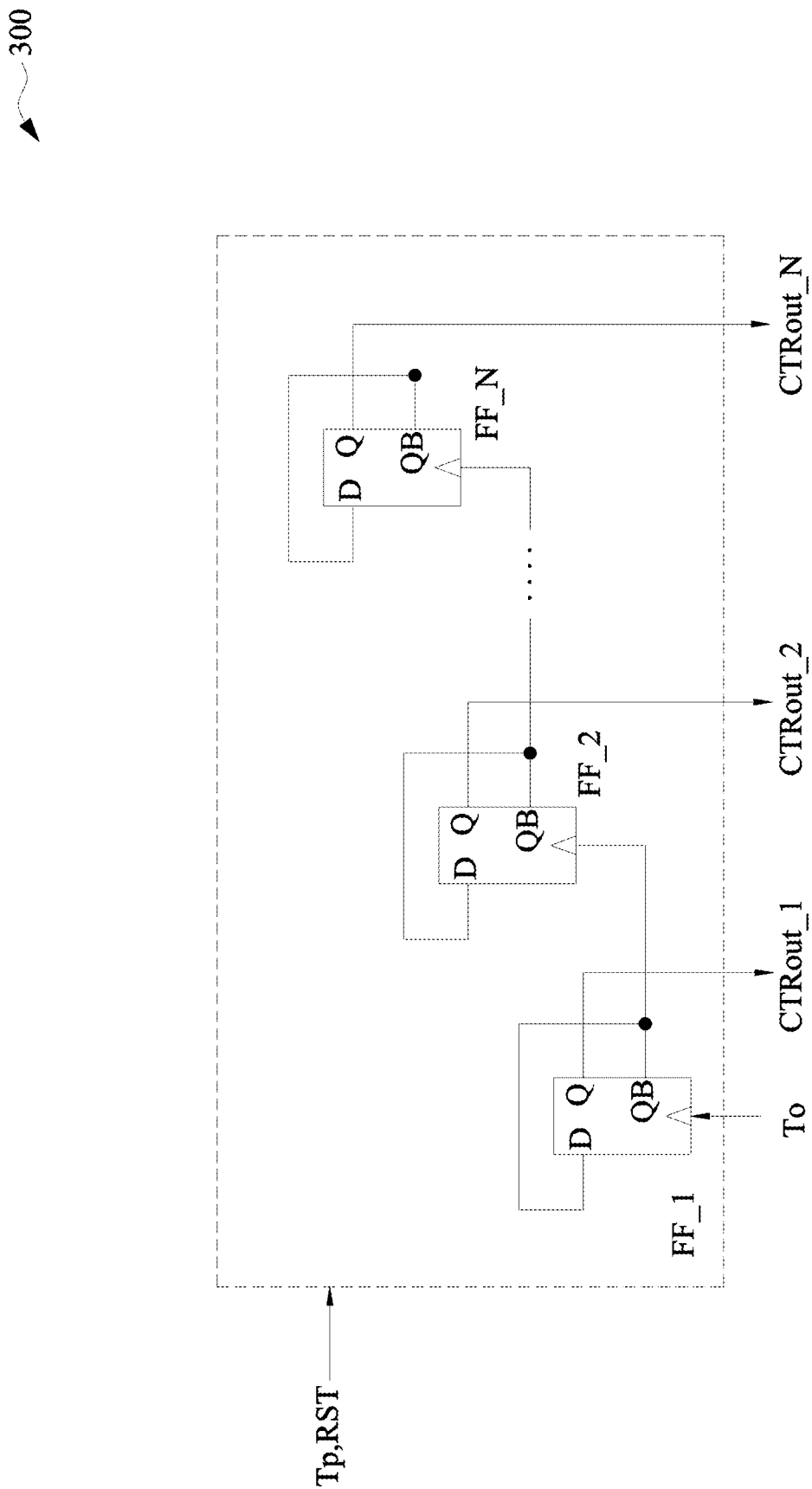
FIG. 3 is a schematic diagram of a ripple counter in accordance with one or more embodiments.

FIG. 3 is a schematic diagram of a ripple counter 300 in accordance with one or more embodiments. Ripple counter 300 is an embodiment of frequency counter 112 shown in FIG. 1 with similar elements.

Ripple counter 300 is configured to receive reset control signal RST and time period control signal Tp from the controller (not shown). Ripple counter 300 is configured to receive signal To with oscillation frequency Fo from the multiplexer (not shown). Ripple counter 300 is configured to count oscillation frequency Fo of signal To during the duration or window indicated by time period control signal Tp. The count of ripple counter 300 is configured to be reset upon receipt of the reset control signal RST. In some embodiments, the duration indicated by time period control signal Tp is fixed during one period of the measurement/count cycle. In some embodiments, the duration indicated by time period control signal Tp is selectively adjusted before or after a completed measurement/count cycle or period.

Ripple counter 300 is configured to send the measured oscillation frequency Fo of signal To to interface 114. Ripple counter 300 is configured to output the count (e.g., counter output signal CTRout_1, CTRout_2 and CTRout_N, where N is an integer corresponding to the number of flip-flops) of the measured oscillation frequency Fo of signal To to interface 114. In some embodiments, ripple counter 300 is an asynchronous ripple counter.

Ripple counter 300 comprises flip-flop FF_1, FF_2, . . . FF_N, where N is an integer corresponding to the number of stages of flip-flops in ripple counter 300. In some embodiments, N is an integer corresponding to the number of bits output by the ripple counter 300. In some embodiments, the number of bits output by the ripple counter 300 corresponds to the number of stages N of flip-flops in ripple counter 300. In some embodiments, the implementation of ripple counter 300 is flexible such that the number of bits (e.g., bit length) output by the ripple counter 300 is varied to achieve different resolutions.

Flip-flop FF_1 is connected to flip-flop FF_2. Flip-flop FF_1 comprises an input port D, a clock input port CLK, an output port Q and an output port QB. Output port QB is a logically inverted version of output port Q.

Clock input port CLK of flip-flop FF_1 is configured to receive a clock signal. In some embodiments, clock input port CLK of flip-flop FF_1 is configured to receive signal To with oscillation frequency Fo as the clock signal.

Input port D of flip-flop FF_1 is configured to receive an inverted version of counter output signal CTRout_1.

Output port Q of flip-flop FF_1 is configured to output the counter output signal CTRout_1.

Output port QB of flip-flop FF_1 is configured to output the inverted version of counter output signal CTRout_1. Output port QB of flip-flop FF_1 is electrically connected to the clock input of the next Flip-Flop stage (e.g., flip-flop FF_1). Output port QB of flip-flop FF_1 is electrically connected to the input port D of flip-flop FF_1.

Flip-flop FF_2 is an embodiment of flip-flop FF_1 shown in FIG. 3 with similar elements. Flip-flop FF_N is an embodiment of flip-flop FF_2 shown in FIG. 3 with similar elements.

Clock input port CLK of flip-flop FF_2 is configured to receive a clock signal. In some embodiments, clock input port CLK of flip-flop FF_2 is configured to receive the inverted version of counter output signal CTRout_1 from flip-flop FF_1.

Output port Q of flip-flop FF_2 is configured to output the counter output signal CTRout_2.

Output port QB of flip-flop FF_2 is configured to output the inverted version of counter output signal CTRout_2. Output port QB of flip-flop FF_2 is electrically connected to the clock input of the next flip-flop stage (e.g., flip-flop FF_N–1). Output port QB of flip-flop FF_2 is electrically connected to the input port D of flip-flop FF_2.

Each of the connections for flip-flop FF_2 repeat for each subsequent stage of flip-flop FF_N, where N is an integer. Output port Q of flip-flop FF_N is configured to output the counter output signal CTRout_N.

Although ripple counter 300 of FIG. 3 illustrates D-type flip-flops, alternative embodiments include JK-type flip-flops, consistent with the teachings disclosed herein.

Figure 4A:
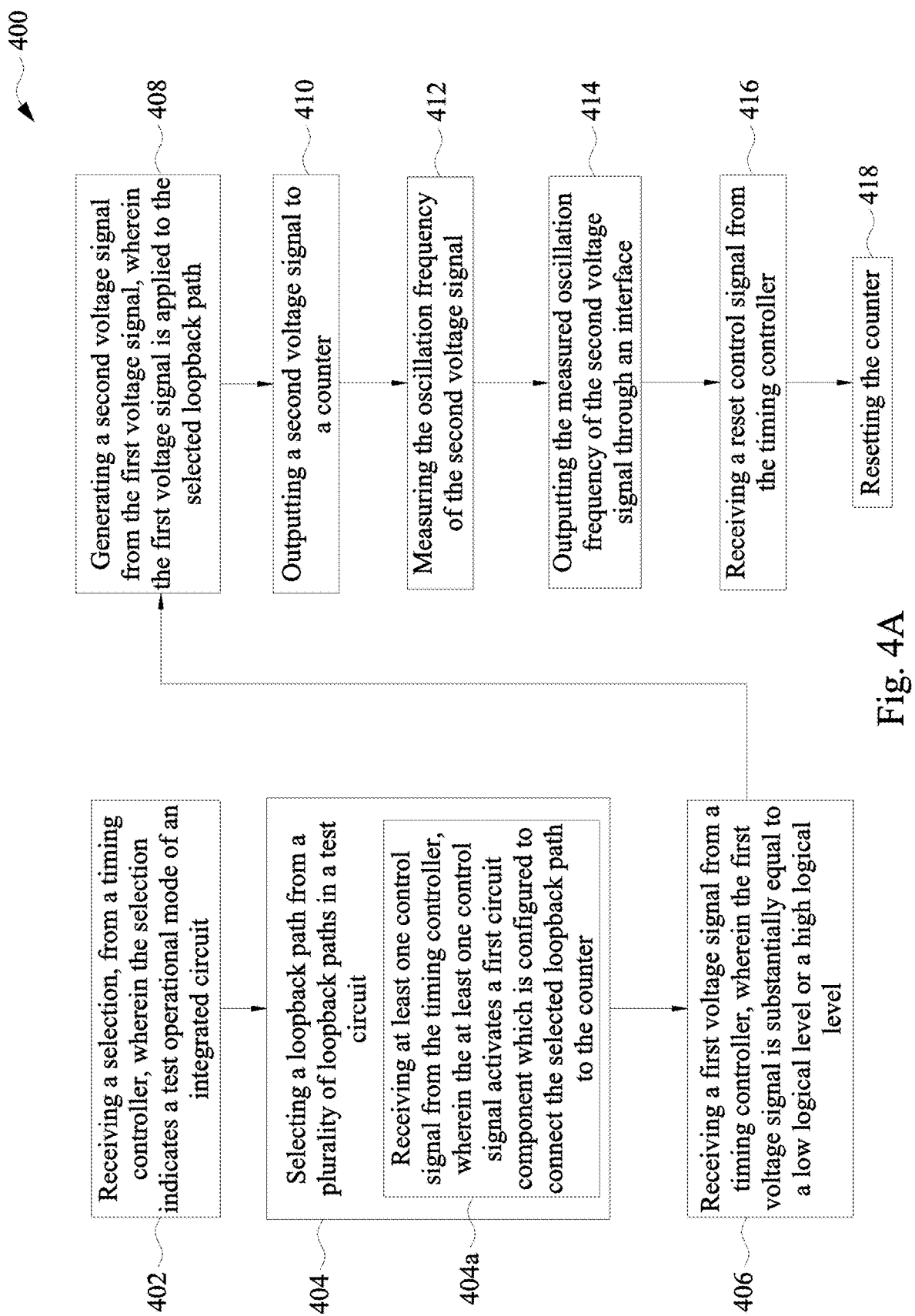
FIG. 4A is a flow chart of a method of testing an integrated circuit in accordance with one or more embodiments.

FIG. 4A is a flow chart of a method 400 of testing an integrated circuit in accordance with some embodiments. Method 400 begins with operation 402 where a selection (e.g., selection control signal SEL), is received from a timing controller (e.g., controller 106). In some embodiments, the selection indicates a test operational mode of the integrated circuit (e.g., integrated circuit 100). In some embodiments, the selection indicates a normal operational mode of the integrated circuit (e.g., integrated circuit 100).

Method 400 continues with operation 404 in which a loopback path (e.g., path P1, P2 or P3) is selected from a plurality of loopback paths in a test circuit (e.g., test circuit 104). In some embodiments, operation 404 also includes selecting a data path (e.g., the data path formed by buffers B1, B2 and B3 in FIGS. 2A-2B, the data path formed by buffers B1, B2 and B4 in FIGS. 2A-2B, the data path formed by buffers B1 and B5 and inverter I4 in FIGS. 2A-2B) from a plurality of data paths in a test circuit (e.g., test circuit 104). In some embodiments, the test circuit (e.g., test circuit 104) is connected to the integrated circuit (e.g., integrated circuit 100), and the test circuit (e.g., test circuit 104) is configured to test a timing of the integrated circuit (e.g., integrated circuit 100). In some embodiments, operation 404 comprises operation 404a. Operation 404a comprises receiving at least one control signal (e.g., first control signal SD from the timing controller (e.g., controller 106). In some embodiments, the at least one control signal (e.g., first control signal SD activates a first circuit component (e.g., inverter I1, inverter I2 or buffer B7) which is configured to connect the selected loopback path (e.g., path P1, P2 or P3) to the frequency counter (e.g., frequency counter 112).

Method 400 continues with operation 406 in which a first voltage signal (e.g., at least one control signal S) is received from a timing controller (e.g., controller 106). In some embodiments, the first voltage signal (e.g., at least one control signal S) is substantially equal to a low logical level or a high logical level.

Method 400 continues with operation 408 in which a second voltage signal (e.g., signal To) is generated from the first voltage signal. In some embodiments, the first voltage signal is applied to the selected loopback path (e.g., path P1, P2 or P3). In some embodiments, the second voltage signal (e.g., signal To) oscillates between the low logical level and the high logical level at an oscillation frequency (e.g., oscillation frequency Fo).

Method 400 continues with operation 410 in which a second voltage signal (e.g., signal To) is output to a frequency counter (e.g., frequency counter 112 or ripple counter 300).

Method 400 continues with operation 412 in which the oscillation frequency (e.g., oscillation frequency Fo) of the second voltage signal (e.g., signal To) is measured.

Method 400 continues with operation 414 in which the measured oscillation frequency (e.g., oscillation frequency Fo) of the second voltage signal (e.g., signal To) is output through an interface (e.g., interface 114). In some embodiments, operation 414 comprises outputting the (e.g., oscillation frequency Fo) of the second voltage signal (e.g., signal To).

Method 400 continues with operation 416 in which a reset control signal (e.g., RST control signal) is received from the timing controller (e.g., controller 106).

Method 400 continues with operation 418 in which the frequency counter (e.g., frequency counter 112 or ripple counter 300) is reset.

Figure 4B:
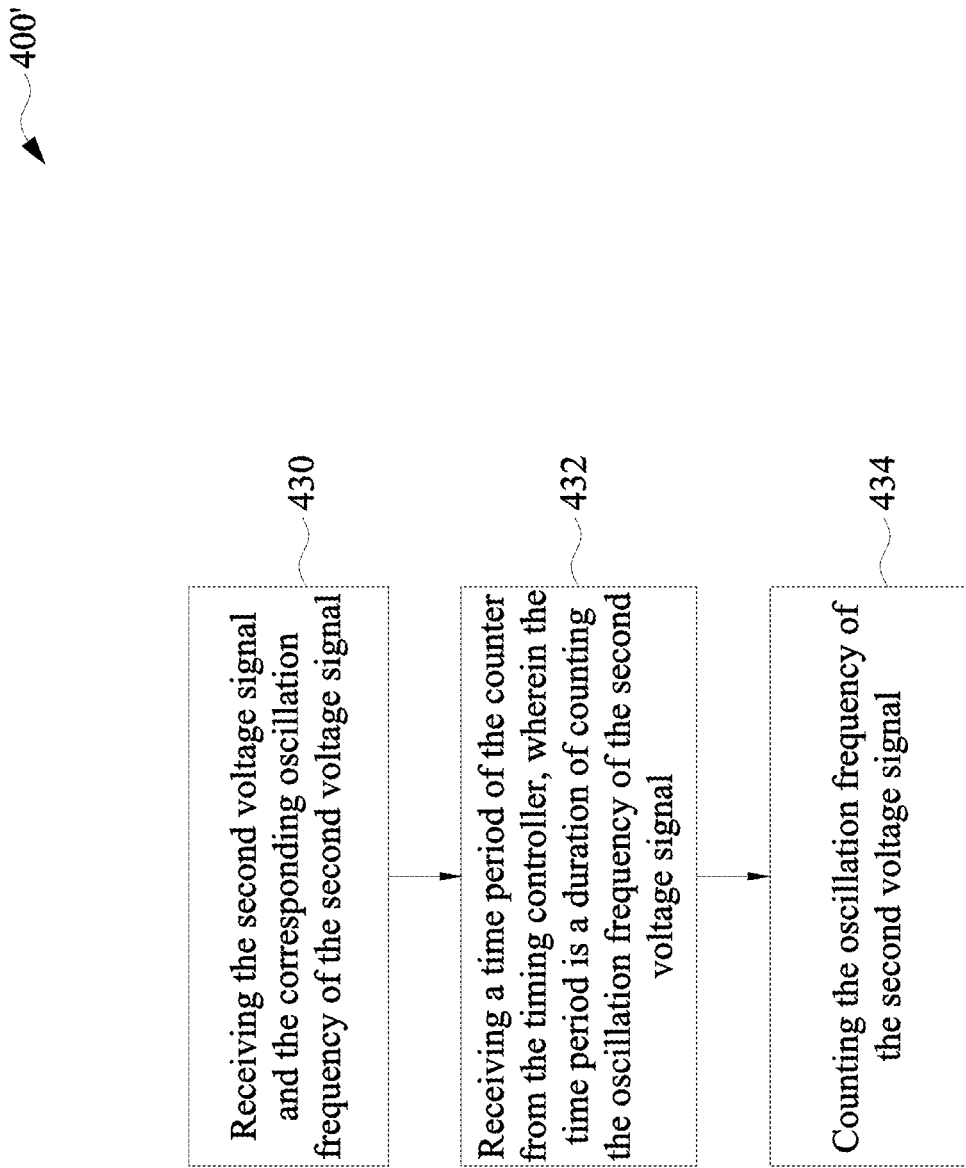
FIG. 4B is a flow chart of a method of measuring an oscillation frequency of a second voltage signal in accordance with some embodiments.

FIG. 4B is a flow chart of a method 400' of measuring an oscillation frequency of a second voltage signal in accordance with some embodiments. Method 400' is an embodiment of operation 414 of method 400 shown in FIG. 4A.

Method 400' begins with operation 430 in which the second voltage signal (e.g., signal To) and the corresponding oscillation frequency (e.g., oscillation frequency Fo) of the second voltage signal (e.g., signal To) are received.

Method 400' continues with operation 432 in which a time period (e.g., time period Tp) of the frequency counter (e.g., frequency counter 112) is received from the timing controller (e.g., controller 106). In some embodiments, the time period (e.g., time period Tp) is a duration of counting the oscillation frequency (e.g., oscillation frequency Fo) of the second voltage signal (e.g., signal To).

Method 400' continues with operation 434 where the oscillation frequency (e.g., oscillation frequency Fo) of the second voltage signal (e.g., signal To) is counted.

In some embodiments, operations are able to be removed or that additional operations are able to be added to methods 400 and 400' without departing from the scope of this description. In some embodiments, an order of operations in methods 400 and 400' are able to be adjusted without departing from the scope of this description.

Figure 5:
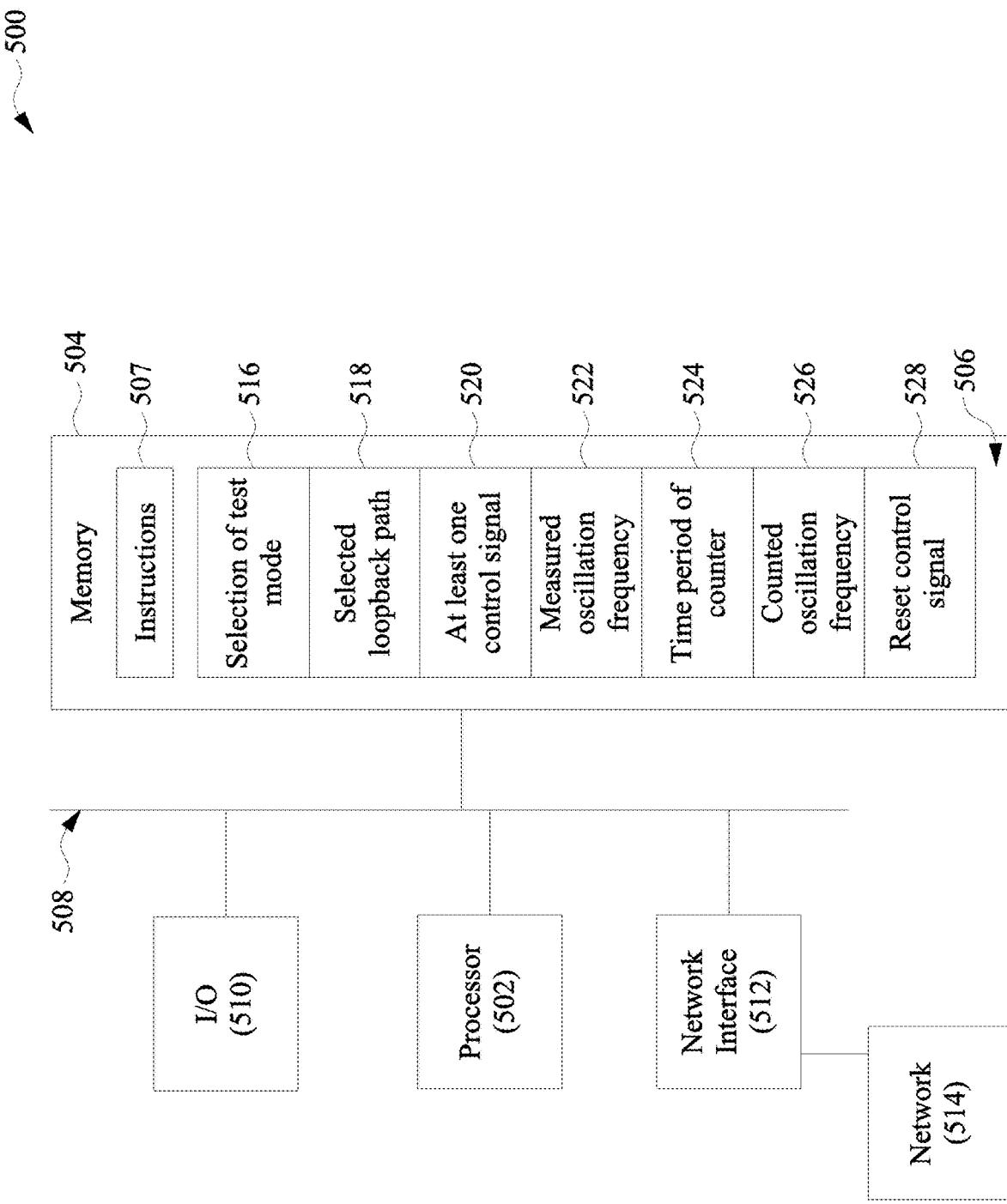
FIG. 5 is a block diagram of a controller in accordance with one or more embodiments.

FIG. 5 is a block diagram of a controller 500 for testing an integrated circuit in accordance with one or more embodiments. In some embodiments, the controller 500 is an embodiment of the controller 106 shown in FIG. 1 with similar elements. In some embodiments, controller 500 is a general purpose computing device which implements method 400 of FIG. 4A and method 400' of FIG. 4B in accordance with one or more embodiments. Controller 500 includes a hardware processor 502 and a non-transitory, computer readable storage medium 504 encoded with, i.e., storing, the computer program code 506, i.e., a set of executable instructions. Computer readable storage medium 504 is also encoded with instructions 507 for interfacing with controller 500 for testing the integrated circuit. The processor 502 is electrically coupled to the computer readable storage medium 504 via a bus 508. The processor 502 is also electrically coupled to an I/O interface 510 by bus 508. A network interface 512 is also electrically connected to the processor 502 via bus 508. Network interface 512 is connected to a network 514, so that processor 502 and computer readable storage medium 504 are capable of connecting to external elements via network 514. The processor 502 is configured to execute the computer program code 506 encoded in the computer readable storage medium 504 in order to cause controller 500 to be usable for performing a portion or all of the operations as described e.g., in methods 400 and 400'.

In one or more embodiments, the processor 502 is a central processing unit (CPU), a multi-processor, a distributed processing system, an application specific integrated circuit (ASIC), and/or a suitable processing unit. The processor 502 is an embodiment of controller 106 in FIG. 1 with similar elements.

In one or more embodiments, the computer readable storage medium 504 is an electronic, magnetic, optical, electromagnetic, infrared, and/or a semiconductor system (or apparatus or device). For example, the computer readable storage medium 504 includes a semiconductor or solid-state memory, a magnetic tape, a removable computer diskette, a random access memory (RAM), a read-only memory (ROM), a rigid magnetic disk, and/or an optical disk. In one or more embodiments using optical disks, the computer readable storage medium 504 includes a compact disk-read only memory (CD-ROM), a compact disk-read/write (CD-R/W), and/or a digital video disc (DVD).

In one or more embodiments, the storage medium 504 stores the computer program code 506 configured to cause controller 500 to perform method 400 or 400'. In one or more embodiments, the storage medium 504 also stores information needed for performing method 400 or 400' as well as information generated during performing method 400 or 400', such as selection of test mode 516, selected loopback path 518, at least one control signal 520, measured oscillation frequency 522, time period of frequency counter 524, counted oscillation frequency 526, reset control signal 528, and/or a set of executable instructions to perform the operation of method 400 or 400'.

In one or more embodiments, the storage medium 504 stores instructions 507 for interfacing with external machines. The instructions 507 enable processor 502 to generate instructions readable by the external machines to effectively implement method 400 or 400' during a method of testing an integrated circuit.

Controller 500 includes I/O interface 510. I/O interface 510 is coupled to external circuitry. In one or more embodiments, I/O interface 510 includes a keyboard, keypad, mouse, trackball, trackpad, touchscreen, and/or cursor direction keys for communicating information and commands to processor 502.

Controller 500 also includes network interface 512 coupled to the processor 502. Network interface 512 allows controller 500 to communicate with network 514, to which one or more other computer systems are connected. Network interface 512 includes wireless network interfaces such as BLUETOOTH, WIFI, WIMAX, GPRS, or WCDMA; or wired network interfaces such as ETHERNET, USB, or IEEE-1394. In one or more embodiments, method 400 or 400' are implemented in two or more controller 500, and information such as selection of test mode 516, selected loopback path 518, at least one control signal 520, measured oscillation frequency 522, time period of frequency counter 524, counted oscillation frequency 526 and reset control signal 528.

Controller 500 is configured to receive information related to a UI through I/O interface 510. The information is transferred to processor 502 via bus 508 to generate a selection of test mode. The UI is then stored in computer readable medium 504 as selection of test mode 516. Controller 500 is configured to receive information related to a selected loopback path through I/O interface 510. The information is stored in computer readable medium 504 as selected loopback path 518. Controller 500 is configured to receive information related to at least one control signal through I/O interface 510. The information is stored in computer readable medium 504 as at least one control signal 520. Controller 500 is configured to receive information related to measured oscillation frequency through I/O interface 510. The information is stored in computer readable medium 504 as measured oscillation frequency 522. Controller 500 is configured to receive information related to a time period of frequency counter through I/O interface 510. The information is stored in computer readable medium 504 as time period of frequency counter 524. Controller 500 is configured to receive information related to a counted oscillation frequency time period of frequency counter through I/O interface 510. The information is stored in computer readable medium 504 as counted oscillation frequency 526. Controller 500 is configured to receive information related to a reset control signal through I/O interface 510. The information is stored in computer readable medium 504 as reset control signal 528.

In some embodiments, integrated circuit 100 is an embedded process variation measurement (EPVM) circuit. As shown in FIGS. 1-5, by utilizing the test circuit 104 with the first circuit 102 in the integrated circuit 100 shown in FIG. 1, the distance between the test circuit 104 and the first circuit 102 is reduced when compared with other OCV measurement circuits. In some embodiments, integrated circuit 100 has lower measurement errors than other OCV measurement circuits. In some embodiments, the resolution of integrated circuit 100 is good when compared with other OCV measurement circuits. In some embodiments, integrated circuit 100 is a BIST circuit. In some embodiments, each of the circuits in integrated circuit 100 are digital circuits. In some embodiments, by utilizing the teachings disclosed herein for integrated circuit 100, integrated circuit 100 does not utilize additional bond pads when compared with other OCV measurement circuits. In some embodiments, integrated circuit 100 can be utilized with digital testing equipment that is configured to utilize JTAG, I2C or SPI.

In an embodiment, an integrated circuit for testing a circuit includes a first circuit comprising a loopback path electrically coupled to an inverter; and a test circuit comprising a controller and a counter, wherein the test circuit is electrically coupled to the first circuit, and wherein the controller is configured to select the loopback path, wherein the first circuit is configured to receive a first voltage signal, wherein the first voltage signal is either a substantially low logic level signal or a substantially high logic level signal, and generate an oscillating signal from the received first voltage signal, and the counter is configured to count oscillations of the oscillating signal. In an embodiment, the integrated circuit includes a second circuit having a plurality of input terminals electrically coupled to the first circuit, and an output terminal electrically coupled to the counter. In an embodiment, the test circuit comprises an encoder electrically coupled to an output terminal of the controller; and an interface electrically coupled to an input terminal of the controller. In an embodiment, the first circuit comprises a first flip-flop circuit having an input terminal configured to receive the first voltage signal. In an embodiment, the first circuit comprises a second flip-flop circuit having an input terminal configured to receive a second voltage signal, wherein the second voltage signal is an inversion of the first voltage signal. In an embodiment, the counter comprises a ripple counter electrically coupled to the controller and configured to receive a reset control signal and a time period control signal from the controller.

In an embodiment, a test circuit includes a controller electrically coupled to a first circuit, and configured to activate a first feedback path of the first circuit, disable a second feedback path of the first circuit, and output a first voltage signal, wherein the first voltage signal is either a substantially low logic level signal or a substantially high logic level signal; a frequency counter electrically coupled to the controller and configured to receive a second voltage signal from the first circuit, wherein the second voltage signal is derived from the first voltage signal; an interface electrically coupled to the controller and the frequency counter, wherein the interface is configured to receive a counter output signal from the frequency counter; and an output pad electrically coupled to an output terminal of the interface and configured to receive a measured oscillation frequency of the first circuit. In an embodiment, the frequency counter is configured to count oscillations of the second voltage signal for a duration derived from a time period control signal received at an input pad of the test circuit. In an embodiment, the test circuit is configured to reset the frequency counter based on a reset control signal received at the input pad of the test circuit. In an embodiment, the test circuit includes a ring output pad and a multiplexer electrically coupled to the ring output pad and the frequency counter. In an embodiment, the test circuit includes a second circuit electrically coupled to the controller, and configured to receive the first voltage signal from the controller and output to the first circuit the first voltage signal and at least one feedback path activation signal.

In an embodiment, a circuit includes a plurality of loopback paths each being selectable as a selected loopback path, a data path electrically coupled to the selected loopback path, and a multiplexer having an input receiving a second voltage signal generated from a first voltage signal. The first voltage signal has one of a substantially low logical level signal or a substantially high logical level signal. The multiplexer has an output operationally coupled to the selected loopback path and the data path. The second voltage signal oscillates between a substantially low logical level and a substantially high logical level at an oscillation frequency. The circuit further includes a counter electrically connecting the selected loopback path of the plurality of loopback paths and receiving the second voltage signal. The counter is electrically connected to the selected loopback path.

The foregoing outlines features of several embodiments so that those of ordinary skill in the art may better understand the aspects of the present disclosure. Those of ordinary skill in the art should appreciate that they may readily use the present disclosure as a basis for designing or modifying other circuits, processes and structures for carrying out the same purposes and/or achieving the same advantages of the embodiments introduced herein. Those of ordinary skill in the art should also realize that such equivalent constructions do not depart from the spirit and scope of the present disclosure, and that they may make various changes, substitutions, and alterations herein without departing from the spirit and scope of the present disclosure.

What is claimed is:

1. An integrated circuit for testing a circuit, the integrated circuit comprising:
   a first circuit comprising a loopback path electrically coupled to an inverter; and
   a test circuit comprising a controller and a counter, wherein the test circuit is electrically coupled to the first circuit, and wherein the controller is configured to select the loopback path, wherein
   the first circuit is configured to:
     receive a first voltage signal, wherein the first voltage signal is either a substantially low logic level signal or a substantially high logic level signal, and
     generate an oscillating signal from the received first voltage signal, and the counter is configured to count oscillations of the oscillating signal.

2. The integrated circuit of claim 1, further comprising:
   a second circuit having a plurality of input terminals electrically coupled to the first circuit, and an output terminal electrically coupled to the counter.

3. The integrated circuit of claim 1, wherein the test circuit further comprises an encoder electrically coupled to an output terminal of the controller; and
   an interface electrically coupled to an input terminal of the controller.

4. The integrated circuit of claim 1, wherein the first circuit further comprises a first flip-flop circuit having an input terminal configured to receive the first voltage signal.

5. The integrated circuit of claim 4, wherein the first circuit further comprises a second flip-flop circuit having an input terminal configured to receive a second voltage signal, wherein the second voltage signal is an inversion of the first voltage signal.

6. The integrated circuit of claim 1, wherein the counter comprises a ripple counter electrically coupled to the controller and configured to receive a reset control signal and a time period control signal from the controller.

7. A test circuit, comprising:
   a controller electrically coupled to a first circuit, and configured to activate a first feedback path of the first circuit, disable a second feedback path of the first circuit, and output a first voltage signal, wherein the first voltage signal is either a substantially low logic level signal or a substantially high logic level signal;
   a frequency counter electrically coupled to the controller and configured to receive a second voltage signal from the first circuit, wherein the second voltage signal is derived from the first voltage signal;
   an interface electrically coupled to the controller and the frequency counter, wherein the interface is configured to receive a counter output signal from the frequency counter; and
   an output pad electrically coupled to an output terminal of the interface, and configured to receive a measured oscillation frequency of the first circuit.

8. The test circuit of claim 7, wherein the frequency counter is configured to count oscillations of the second voltage signal for a duration derived from a time period control signal received at an input pad of the test circuit.

9. The test circuit of claim 8, wherein the test circuit is configured to reset the frequency counter based on a reset control signal received at the input pad of the test circuit.

10. The test circuit of claim 7, further comprising:
    a ring output pad; and
    a multiplexer electrically coupled to the ring output pad and the frequency counter.

11. The test circuit of claim 7, further comprising:
    a second circuit electrically coupled to the controller, and configured to receive the first voltage signal from the controller and output to the first circuit the first voltage signal and at least one feedback path activation signal.

12. A circuit comprising:
a plurality of loopback paths each being selectable as a selected loopback path;
a data path electrically coupled to the selected loopback path;
a multiplexer having an input receiving a second voltage signal generated from a first voltage signal, wherein the first voltage signal has one of a substantially low logical level signal or a substantially high logical level signal, wherein the multiplexer has an output operationally coupled to the selected loopback path and the data path, and wherein the second voltage signal oscillates between a substantially low logical level and a substantially high logical level at an oscillation frequency; and
a counter electrically connecting the selected loopback path of the plurality of loopback paths and receiving the second voltage signal, wherein the counter is electrically connected to the selected loopback path.

13. The circuit of claim 12, wherein the counter is operative to measure the oscillation frequency of the second voltage signal and operative to count oscillations of the second voltage signal.

14. The circuit of claim 13, wherein the counter is operative to output a time period that is a duration of counting oscillations of the second voltage signal.

15. The circuit of claim 14, wherein the counter is operative to be reset in response to receipt of a reset control signal.

16. The circuit of claim 12, wherein the counter is operative to be electrically disconnected from an unselected loopback path.

17. The circuit of claim 12, further comprising:
a first inverter operative to be selectively enabled; and
a second inverter operative to be substantially concurrently disabled.

18. The circuit of claim 12, further comprising:
a flip-flop circuit receiving an inverted first voltage signal that is inverted from the first voltage signal.

19. The circuit of claim 12, wherein the selected loopback path is operative to be enabled based on a state of a first control signal, and wherein an unselected loopback path is operative to be disabled based on a state of a second control signal.

20. The circuit of claim 12, further comprising:
an interface operative to output a measured oscillation frequency of the second voltage signal.

* * * * *